United States Patent
Mann

(10) Patent No.: US 8,558,991 B2
(45) Date of Patent: Oct. 15, 2013

(54) IMAGING OPTICAL SYSTEM AND RELATED INSTALLATION AND METHOD

(75) Inventor: Hans-Juergen Mann, Oberkochen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 355 days.

(21) Appl. No.: 12/758,530

(22) Filed: Apr. 12, 2010

(65) Prior Publication Data

US 2010/0231884 A1    Sep. 16, 2010

Related U.S. Application Data

(63) Continuation of application No. PCT/EP2008/008336, filed on Oct. 2, 2008.

(60) Provisional application No. 60/982,850, filed on Oct. 26, 2007.

(30) Foreign Application Priority Data

Oct. 26, 2007   (DE) .......................... 10 2007 051 669

(51) Int. Cl.
    *G03B 27/54*    (2006.01)
(52) U.S. Cl.
    USPC ................................. 355/67; 355/46; 355/53
(58) Field of Classification Search
    USPC ............. 355/30, 46, 53–55, 67, 72, 77; 250/492.2; 356/252, 399–401; 359/373, 857; 378/34
    See application file for complete search history.

(56) References Cited

U.S. PATENT DOCUMENTS

| | | | |
|---|---|---|---|
| 4,861,148 A | 8/1989 | Sato et al. | |
| 5,268,744 A | 12/1993 | Mori et al. | |
| 6,473,239 B1 | 10/2002 | Völcker et al. | |
| 6,600,608 B1 | 7/2003 | Shafer et al. | |
| 6,631,036 B2 | 10/2003 | Schuster | |
| 7,046,335 B2 | 5/2006 | Miyajima | |
| 2002/0123012 A1 | 9/2002 | Sewell | |
| 2003/0099034 A1* | 5/2003 | Mann et al. | 359/359 |
| 2003/0218730 A1* | 11/2003 | Murakami et al. | 355/53 |
| 2004/0165255 A1* | 8/2004 | Sasaki et al. | 359/359 |
| 2005/0117136 A1* | 6/2005 | Tominaga | 355/53 |

(Continued)

FOREIGN PATENT DOCUMENTS

DE    10 2005 030 839    1/2007
EP         1 978 546 A1    10/2008

(Continued)

OTHER PUBLICATIONS

Poonawala et al., "ILT for Double Exposure Lithography with Conventional and Novel Materials", Proceedings of the SPIE Advanced Lithography Symposium, Feb. 2007.

(Continued)

*Primary Examiner* — Hoon Song
*Assistant Examiner* — Mona M Sanei
(74) *Attorney, Agent, or Firm* — Fish & Richardson P.C.

(57) ABSTRACT

An imaging optical system can image two object fields, each in the same object plane, into two corresponding image fields, each in the same image plane. The two object fields are spatially separated from each another, and the two image fields are spatially separated from each other. The imaging optical system can exhibit increased flexibility of use.

20 Claims, 9 Drawing Sheets

(56) References Cited

U.S. PATENT DOCUMENTS

| | | |
|---|---|---|
| 2005/0190435 A1 | 9/2005 | Shafer et al. |
| 2006/0082905 A1* | 4/2006 | Shafer et al. .................. 359/727 |
| 2007/0153247 A1 | 7/2007 | Nagasaka |
| 2007/0242244 A1 | 10/2007 | Nagasaka |
| 2007/0242255 A1 | 10/2007 | Nagasaka |
| 2007/0273854 A1 | 11/2007 | Nagasaka |
| 2007/0279606 A1* | 12/2007 | Nagasaka ....................... 355/40 |
| 2008/0080281 A1 | 4/2008 | Seo |
| 2008/0117400 A1 | 5/2008 | Rostalski et al. |

FOREIGN PATENT DOCUMENTS

| | | |
|---|---|---|
| JP | 11-084249 | 3/1999 |
| JP | 2000-284494 | 10/2000 |
| JP | 2004-107011 | 4/2004 |
| JP | 2004-519850 | 7/2004 |
| JP | 2007-201457 | 8/2007 |
| JP | 2007-251153 | 9/2007 |
| JP | 2007-311789 | 11/2007 |
| JP | 2008-152272 | 7/2008 |
| WO | WO 2007/077875 | 7/2007 |
| WO | WO 2007/119466 | 10/2007 |

OTHER PUBLICATIONS

Japanese Office Action, with English translation, for corresponding JP Appl No. 2010-530296, dated Nov. 29, 2012.

* cited by examiner

IMAGING OPTICAL SYSTEM AND RELATED INSTALLATION AND METHOD

CROSS-REFERENCE TO RELATED APPLICATIONS

This application is a continuation of, and claims benefit under 35 USC 120 to, international application PCT/EP2008/008336, filed Oct. 2, 2008, which claims benefit of German Application No. 10 2007 051 669.1, filed Oct. 26, 2007 and U.S. Ser. No. 60/982,850, filed Oct. 26, 2007. International application PCT/EP2008/008336 is hereby incorporated by reference in its entirety.

FIELD

Imaging optical systems, as well as related projection exposure installations and methods are disclosed.

BACKGROUND

Imaging optical systems, which may be used in particular in projection exposure installations for microlithography, are known from U.S. Pat. No. 7,046,335 B2, US 2007/0153247 A1, U.S. Pat. No. 6,600,608 B1 and U.S. Pat. No. 6,631,036 B2.

SUMMARY

The disclosure provides an imaging optical system having increased flexibility of use. The imaging optical system can, for example, be used in a projection exposure installation.

In some embodiments, the exclusive use of mirrors in an imaging optical system makes it possible for the optical system to have a broadband use. Two object fields and two image fields can be used simultaneously with a compact construction. Thus, use is not made of two imaging optical systems, but use is made of precisely one imaging optical system, with at least one optical component which is used jointly by the two imaging light paths between the two object fields and the two image fields. Such an imaging optical system can have two object fields and two image fields. The overall result is a compact imaging construction.

In certain embodiments, a folded light path can be disposed with, and an inline construction can be used. The light paths which are associated with the two object fields can exhibit reflectional symmetry with respect to the optical axis. The inline arrangement simplifies the production of the imaging optical system as a whole and likewise contributes to a compact system being achieved.

The distance between the at least two object fields can be at least 50 mm (e.g., at least 100 mm, at least 150 mm, at least 164 mm). The distance between the at least two image fields depends on the distance of the at least two object fields and the imaging factor of the imaging optical system. A distance of at least 100 mm between the at least two object fields and a reduction imaging scale of 10 results, for example, in a distance of 10 mm between the at least two image fields.

With particular mirror constructions, used off-axis, of imaging optical systems, the construction can be widened so that by using two object fields, the object field originally used with the construction and thus also the image field double in size.

In some embodiments, there are always at least two field component groups and at least one aperture component group in each case. The field component groups may be associated with the at least two object fields, the at least two image fields, or even intermediate image fields of the imaging optical system. The two field component groups may be configured so as to be constructionally separated from one another. This makes it possible to provide these two field component groups with different qualities of optical systems and also with different additional components, for example as regards an actuator for displacing individual imaging components or a sensor for measuring, for example, optical parameters of the imaging optical system.

In some embodiments, a mirror group can be in a broadband form and can guide light with a wavelength for which transmissive materials do not exist in a sufficient quality.

In some embodiments, the relative aperture size can lead to a compact construction of the imaging optical system, even with spatial separation between the optically effective surfaces of the beam-guiding components of the field component groups.

In some embodiments, there is a constructional separation of components associated with the two object fields to be achieved. This broadens the possibilities for the use of these two object fields. These may in particular be used by entirely different units, for example a reticle on the one hand and an optical sensing device on the other hand. The opposite arrangement, with two field components which are associated with the two image fields and with an aperture component between the object fields and the two field component groups, is also possible.

In some embodiments, using four field component groups can allow the imaging properties of the field component groups to be influenced in diverse and mutually independent ways.

In some embodiments, it is possible to act upon one field component group with a different wavelength compared to a wavelength used for the a different field component group. This can be taken advantage of in numerous ways, in particular for preparation and measurement purposes. The very same imaging optical system can, for example, be used for EUV exposure and simultaneously for preparation or measurement in the UV range or in the visible wavelength range. Beam-guiding optical components which are used jointly by both wavelengths may have coatings which optimise the passage of light through the imaging optical system and are tuned to both the wavelengths being used.

In some embodiments, object planes are spaced from one another to increase the flexibility of use of the imaging optical system. For example, when using different wavelengths, it is possible in this way to compensate chromatic effects. This can be used to compensate the chromatic variations which are induced by coatings of the beam-guiding optical components of the imaging optical system. Different imaging criteria may be used in the two partial systems, which are associated with mutually distanced object planes, of the imaging optical system. This can then be used for imaging rough structures via a first imaging light path, with which one of the object fields is associated, for example at a reduction scale of 2×, and for imaging fine structures via a further imaging light path, with which another of the object fields is associated, at a higher reduction scale, for example of 16×. Alternatively, it is possible to image-scan various layers of the same object, which are distanced from one another by the distance of the two object planes, where the object is moved parallel to the two object planes between the object fields.

In some embodiments, an optical sensing device can allow the imaging properties in the light path, starting from the associated image field, to be measured. In this way, the image properties of an aperture group can, for example, be controlled online during a projection of an object arranged in the other object field. The measurement result of the optical sensing device can be used as a control value for adjusting the imaging properties of the imaging optical system. A CCD camera in particular may be used as an optical sensing device. The optical sensing device can use measurement light having a wavelength different from that of the illumination light used for the actual imaging.

In some embodiments, it is possible to readjust the imaging properties of the imaging optical system in a closed control circuit.

In some embodiments, it is possible to influence the image properties on the image field side for the two image fields separately. This can also be made use of in numerous ways.

In some embodiments, image fields which are not arranged in a plane can increase the flexibility of use of the imaging optical system.

In some embodiments, image fields are parallel to each other and are spaced a distance from each other. Such embodiments can allow imaging of objects arranged in the two object fields that are in different layer positions of a substrate that is arranged in the region of the image fields. This can in particular be used for three-dimensional structuring in the production of microstructured components.

In some embodiments, an imaging optical system has an imaging scale of 1:1. Individual alterations, i.e. alterations associated with the respective fields of the field component groups, in the imaging properties of the imaging optical system are then possible both on the object field side and on the image field side.

In some embodiments, there is individual separation of the light paths between the aperture component groups for each field. This can be used to analyse one of the two separated light paths, i.e. to use it as a reference light path, or to manipulate one of the two light paths independently of the other. This arrangement may also be configured in such a way as to result in 1:1 imaging.

In some embodiments, the field component can reduce the production costs of the beam-guiding optical components from which they are constructed. For example, each pair of mirrors can be produced together.

In some embodiments, an aperture component group can enable an imaging optical system with a high numerical aperture to be achieved.

In some embodiments, at least one ring field can allow the field shape to be fitted well to the construction of the imaging optical system for given desired imaging properties. If two object fields configured as ring fields and/or two image fields configured as ring fields are used, they may be partial rings of the same ring, and this symmetrises the construction of the imaging optical system. In the case of a ring field, it is desirable for all the fields of the imaging optical system, i.e. both the two object fields and the two ring fields, to be configured as ring fields.

The advantages of a projection exposure installation generally correspond to those previously discussed with regard to the imaging optical system according to the disclosure. The light source of the projection exposure installation may be in the form of a broadband light source and may have, for example, a bandwidth greater than 1 nm, greater than 10 nm or greater than 100 nm. In addition, the projection exposure installation may be constructed in such a way that it can be operated with light sources of different wavelengths, which in particular are associated with the different object fields. Light sources for other wavelengths, in particular wavelengths used for microlithography, can be used in conjunction with the imaging optical system. Exemplary wavelengths include 365 nm, 248 nm, 193 nm, 157 nm, 126 nm and 109 nm. In some cases, wavelengths of less than 100 nm are used.

The disclosure also provides methods for the production of a microstructured component in which the flexibility of use, which is obtained because of the projection exposure installation, is particularly useful.

In some embodiments, a production method can allow the creation of constructions of a critical dimensions which are smaller than those achieved in a single-exposure procedure of the light-sensitive layer of the wafer.

In some embodiments, a method can allow online correction to take place before the projection step, which is decisive in the production of the microstructured component. In such a method, one of the image fields is used as a measurement image field and the other as a projection image field. As a function of the measured wafer topography, alterations can still be made, for example, in the imaging properties of the field component group which is associated with the projection image field. It is possible alternatively or additionally to further adjust the positioning of the wafer in the projection image field. This is also known as a line of sight correction.

In some embodiments, online-monitoring of the success of the projection step is possible. In this way, it is possible to achieve a quick quality control check of the operation of the projection exposure installation.

BRIEF DESCRIPTION OF THE DRAWINGS

Embodiments of the disclosure will be described in the following in greater detail with reference to the drawings, in which.

DETAILED DESCRIPTION

Figure 1:
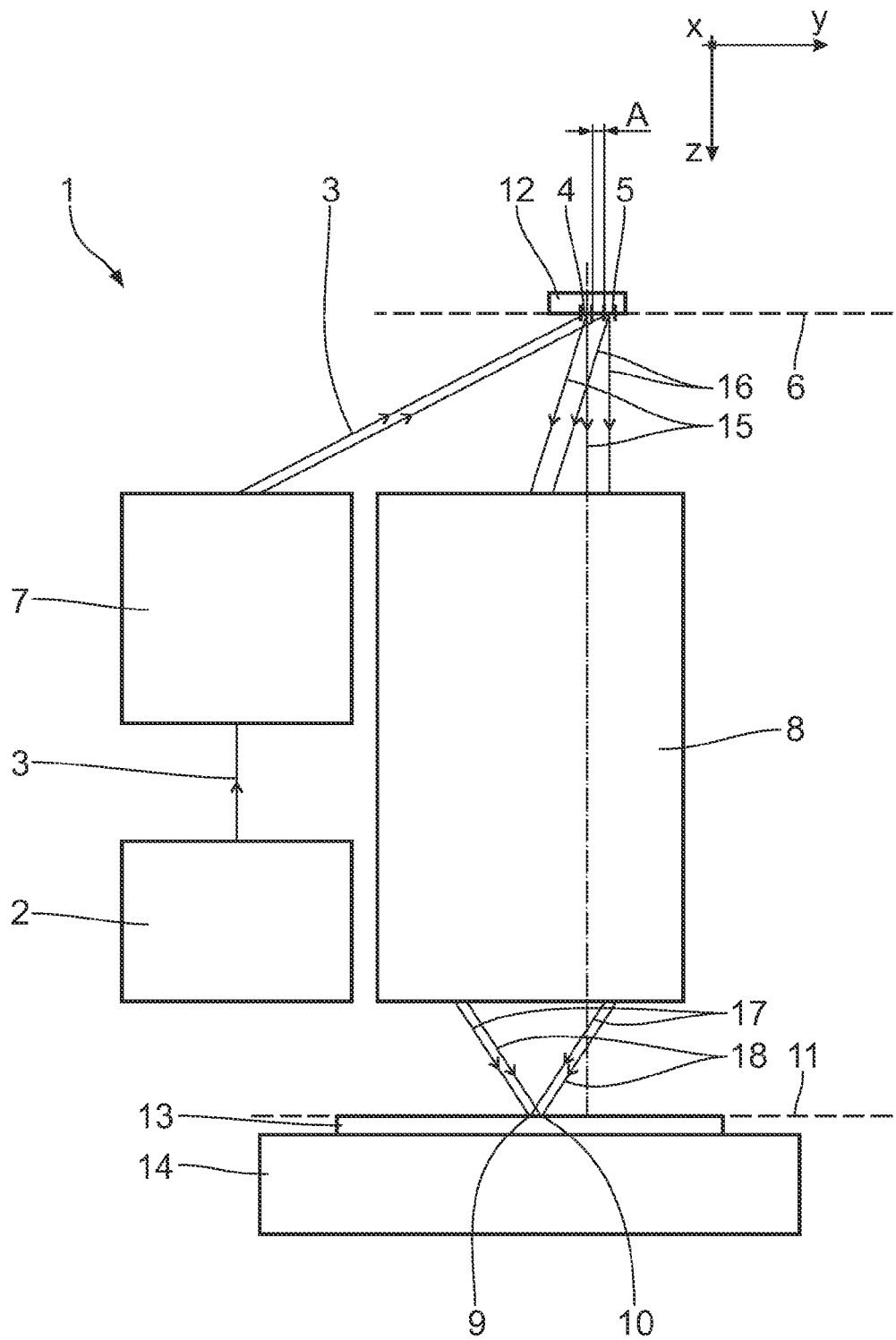
FIG. 1 is a schematic view of a projection exposure installation for EUV microlithography.

A projection exposure installation 1 for microlithography, schematically shown in FIG. 1, has a light source 2 for illumination light. The light source 2 is a EUV light source which produces light in a wavelength range in particular of between 5 nm and 30 nm. Other EUV wavelengths are also possible. In general, any desired wavelengths, for example visible wavelengths or any other wavelengths which are used for example in microlithography and are available for the appropriate laser light sources and/or LED light sources, for example 365 nm, 248 nm, 193 nm, 157 nm, 129 nm or 109 nm, are possible for the illumination light guided in the projection exposure installation 1. A light path of the illumination light 3 is very schematically shown in FIG. 1.

In order to aid the description of the projection exposure installation 1 and the components thereof, an xyz Cartesian coordinate system is provided in the drawings and shows the respective locations of the components shown in the figures. In FIG. 1, the x direction extends perpendicular to and into the drawing plane. The y direction extends to the right and the z direction extends downwards.

The illumination light 3 exposes two object fields 4, 5, which are spatially separated from one another in the y direction by a distance A (cf. also FIGS. 9 and 10), and which lie in a common object plane 6, which is perpendicular to the drawing plane in FIG. 1. The object fields 4, 5 may be ring fields or also rectangular fields.

A lens system 7 guides the illumination light 3 from the light source 2 to the object fields 4, 5. With a projection optical system 8, i.e. an imaging optical system, the two object fields 4, 5 are imaged in two image fields 9, 10 associated therewith, which are likewise arranged so as to spaced from one another, in a common image plane 11 with a prespecified reduction scale. The image plane 11 lies parallel to the object plane 6. In FIG. 1, the image fields 9, 10 are so small that they are not shown spatially extended in the image plane 11. One of the embodiments shown in the following figures can be used for the projection optical system 8. The projection optical system 8 has for example a reduction factor of 8. Other imaging factors or reduction scales are also possible, for example 4×, 5×, or even reduction scales that are greater than 8×. 1:1 imaging is also possible. An imaging magnification level of 8× is particularly suitable for the illumination light 3 with an EUV wavelength, since the object-side angle of incidence on a reflection mask 12 can thus remain small. An imaging magnification level of 8× does not require, in addition, unnecessarily large masks to be used. The projection optical system 8 images portions of the reflection mask 12, also referred to as a reticle, which coincide with the object fields 4, 5.

The image fields 9, 10 are curved in an arc shape in the image plane 11. The distance between the two arc curves which delimit the image fields 9, 10 is 1 mm. 1 mm is also the side length of the straight side edges which delimit the image fields 9, 10 between the two arc curves and which extend parallel to one another and to the y-axis. The drawing plane of FIG. 1 extends parallel to these side edges of the image planes 9, 10. These two straight side edges of the image fields 9, 10 are at a distance of 13 mm from one another.

The area of the two curved image fields 9, 10 corresponds to a rectangular image field with edge-lengths of 1 mm×13 mm. Rectangular image fields of this type are also possible instead of the image fields 9, 10. Rectangular image fields are produced for example when using catoptric systems with free-form surfaces as reflection surfaces or when using catadioptric systems.

Imaging takes place on the surface of a substrate 13 in the form of a wafer, which is supported by a substrate support 14. FIG. 1 schematically shows, between the reticle 12 and the projection optical system 8, light beams 15, 16 of the illumination light 3. In this case, the light beam 15 departs from the object field 4 and the light beam 16 from the object field 5. Between the projection optical system 8 and the substrate 13, two light beams 17, 18 of the illumination light exit from the projection optical system 8. The light beam 17 exposes the image field 9 and the light beam 18 exposes the image field 10.

The paths of the light beams 15 to 18 are shown very schematically in FIG. 1. In particular, the light beams 15 and 17 on one side and 16 and 18 on the other may extend symmetrically in relation to an assigned axis, such as the optical axis of the projection optical system 8.

The projection exposure installation 1 is a scanner-type device. Both the reticle 12 and the substrate 13 are scanned in the y direction during the operation of the projection exposure installation 1. Alternatively, the projection exposure installation 1 can be a step-per-type device. In this case, the substrate support 14 and a reticle support (not shown), which is associated with the reflection mask 12, are displaced stepwise between individual exposes in the y direction.

Figure 2:
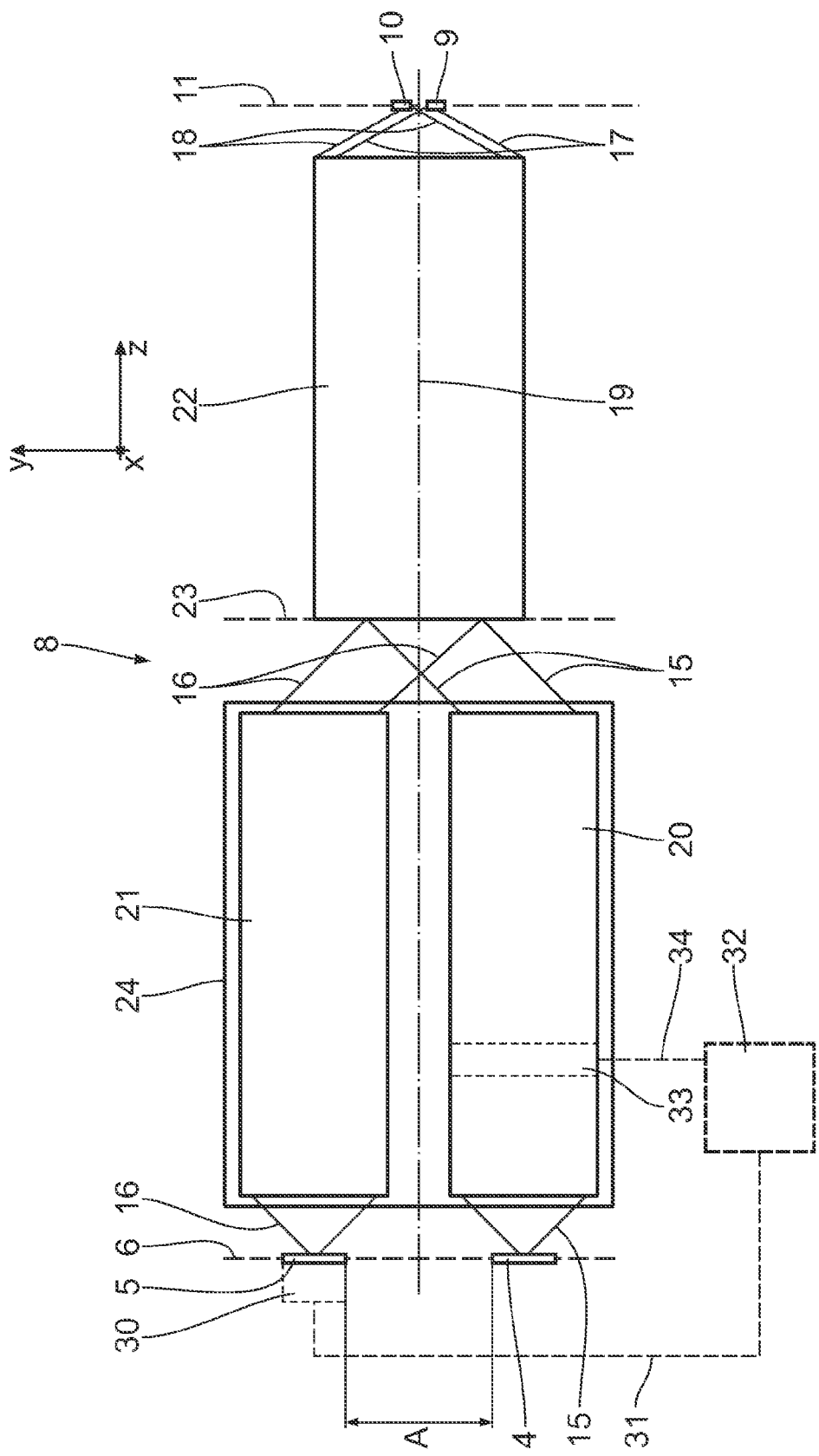
FIG. 2 is a schematic view of an imaging optical system of the projection exposure installation including two field mirror groups, each between one of two object fields and an entrance pupil plane of the imaging optical system, and an aperture mirror group, between the entrance pupil plane and two image planes respectively associated with the object planes.

FIG. 2 shows schematically a variant of the projection optical system 8 of the projection exposure system 1. Components which correspond to those which have been previously explained with reference to FIG. 1 like reference numerals and will not be discussed in detail again.

FIG. 2 shows schematically the construction of a first embodiment of the projection optical system 8. This is configured as an inline system. All beam-guiding components of the projection optical system 8 may be associated with the same continuous optical axis 19, which thus extends without bends, throughout.

The projection optical system 8 of FIG. 2 has three component groups 20, 21, 22, which are each constructed as beam-guiding optical components.

The two component groups 20, 21 shown on the left in FIG. 2 are field groups, in which the light beams 15, 16, which proceed respectively from the object fields 4, 5, are guided. The light beams 15, 16 are guided separately from one another in the two field groups 20, 21.

In FIG. 2, the field group 20 is arranged below the field group 21. The field group 20 lies between the object field 4 and a pupil plane 23 of the projection optical system 8. The two light beams 15, 16 exiting the field groups 20, 21 overlap in the pupil plane 23.

The component group 22 shown on the right in FIG. 2 is an aperture group, in which the light beams 15, 16, i.e. the imaging rays which proceed from all of the object planes 4, 5, are guided. The aperture group 22 is arranged between the pupil plane 23 and the two image fields 9, 10.

The component groups 20 to 22 of the embodiment of FIG. 2 are pure mirror groups or catoptric groups, i.e. component groups which include exclusively mirrors as beam-guiding optical components. In principle, the component groups 20 to 22 may also be catadioptric or dioptric groups.

The two field groups 20, 21 may be constructionally completely separate from one another, but may however be integrated to form one constructional unit, as is indicated in FIG. 2, with a common housing 24.

Figure 3:
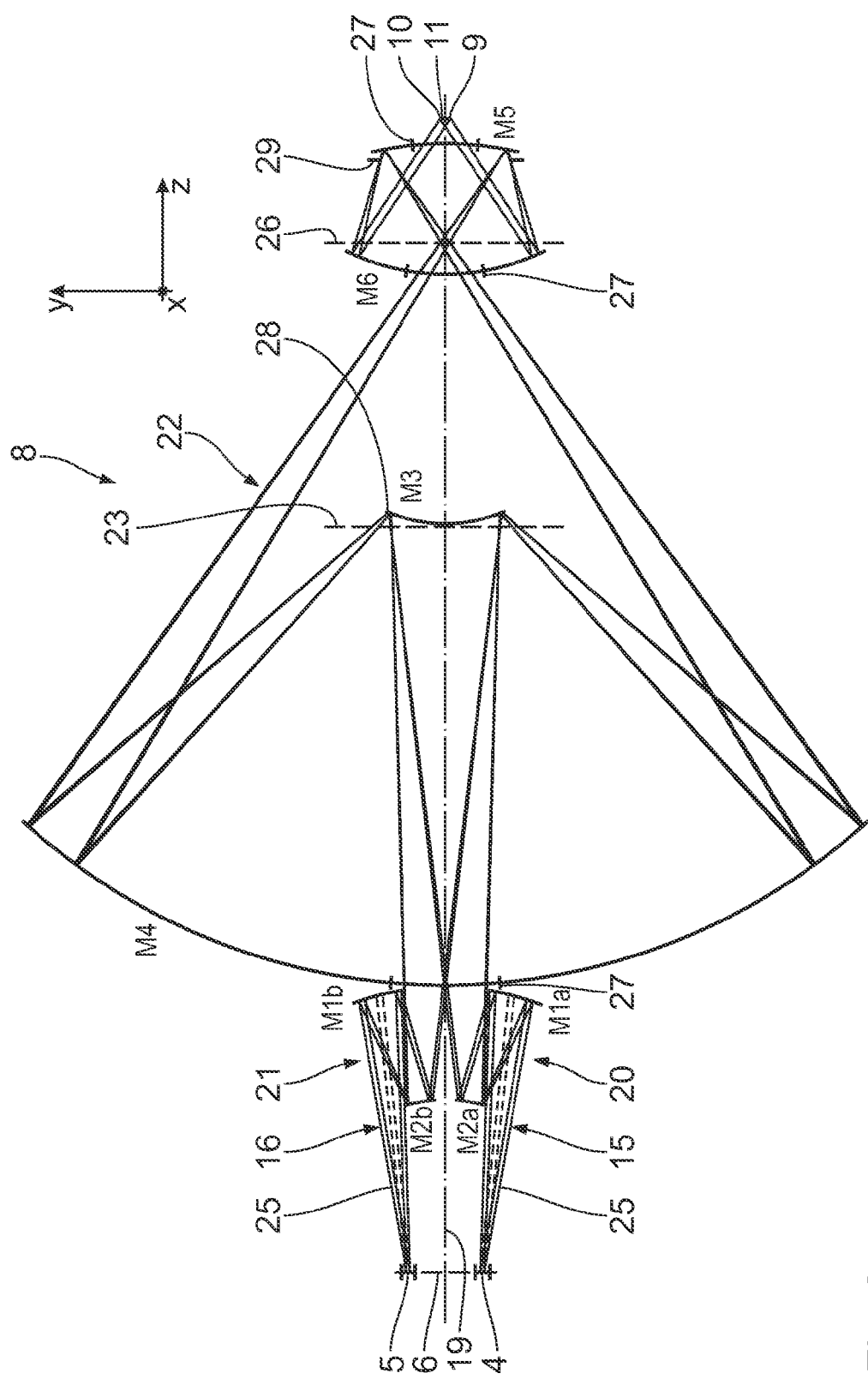
FIG. 3 is a meridional section of a first variant of an optical construction of the imaging optical system of FIG. 2.

FIG. 3 shows a first constructional variant of the projection optical system 8. Components which correspond to those which have been previously explained with reference to FIGS. 1 and 2 have like reference numerals and will not be discussed in detail again.

Object fields 4 and 5 are each shown as having two object points, from each of which three individual rays 25 proceed. The three individual rays 25 for each object point proceed from the object point at different angles. Although not shown in FIG. 3, the principal ray proceeding from each object point extends through the centre of the pupil plane 23 of the projection optical system 8.

The individual rays 15, in each case associated with the same illumination angle of a field point, extend divergently from the respective object field 4, 5. This is referred to in the following as a negative back focal length of the entrance pupil. An entrance pupil of the projection optical system 8 of FIG. 3 lies not inside the projection optical system 8 but before the object fields 4, 5 in the light path. Alternatively, a positive back focal length of the entrance pupil or a telecentric light path on the object side is possible, for example when using a ray divider element for illuminating a reflection mask or when using a transmission mask. This makes it possible, for example, to arrange a pupil component of the illumination optical system 7 in the entrance pupil of the projection optical system 8, before the projection optical system 8 in the light path, without further imaging optical components having to be present between these pupil components and the object fields 4, 5.

The field group 20 of the projection optical system 8 has two mirrors M1a, M2a. The field group 21 of the projection optical system 8 likewise has two mirrors M1b and M2b. Where, in the following, the references M1, M2 are used instead of the references M1a/b, M2a/b within a field group, for example, they refer in each case to both mirrors M1a/b, M2a/b. The numbering of the mirrors of the projection optical system 8 are numbered in the sequence of the light path, proceeding from the object fields 4 and 5. The mirrors M1a and M1b and the mirrors M2a and M2b each have reflection surfaces which are arranged on the same surface, which is rotationally symmetric about the optical axis 19.

After the mirrors M1a/b and M2a/b, the projection optical system 8 also includes four further mirrors M3, M4, M5 and M6, which belong to the aperture group 22.

FIG. 3 shows only the reflection surfaces of the mirrors M1 to M6. The reflection surfaces of the mirrors M1 to M6 are as a whole at least portions in each case of a surface which is rotationally symmetrical in relation to the optical axis 19. The mirrors M1, M4, M5 and M6 are formed as concave mirrors. The mirrors M2 and M3 are formed as convex mirrors.

The optical data for the projection optical system 8 of FIG. 3 are shown in the following two tables.

In the column "radius", the first table shows in each case the reciprocal of the curvature c of the mirrors M1 to M6. The third column (thickness) describes the distance from the object plane 6 to the following surface in each case.

The second table describes the precise surface form of the reflection surfaces of the mirrors M1 to M6, where the constants K and A to G are to be put into the following equation for the sagittal height:

$$z(h) == \frac{ch^2}{1 + SQRT\{1 - (1 + K)c^2h^2\}} ++ Ah^4 + Bh^6 + Ch^8 + Dh^{10} + Eh^{12} + Fh^{14} + Gh^{16}$$

In this case, h represents the distance from the optical axis 19. Therefore: $h^2 = x^2 + y^2$. The reciprocal of "radius" is used for c.

| Surface | Radius | Thickness | Operating mode |
|---|---|---|---|
| Object plane | INFINITY | 683.665 | |
| M1 | −694.834 | −271.324 | REFL |
| M2 | −411.527 | 1372.036 | REFL |
| M3 | 346.281 | −1100.613 | REFL |
| M4 | 1469.502 | 2005.780 | REFL |
| M5 | −722.731 | −41.563 | REFL |
| STOP | INFINITY | −272.149 | |
| M6 | 544.465 | 370.467 | REFL |
| Image plane | INFINITY | 0.000 | |

| Surface | K | A | B | C |
|---|---|---|---|---|
| M1 | 7.396949 | −8.591818E−11 | 2.958631E−15 | −1.515085E−19 |
| M2 | −4.696303E−01 | −1.639186E−09 | −1.894486E−14 | −4.136066E−18 |
| M3 | −5.224549E−01 | −2.010111E−09 | −1.293006E−14 | −2.918315E−20 |
| M4 | −3.021297E−02 | 9.250522E−14 | 5.057734E−20 | 4.887335E−28 |
| M5 | −3.126684E+00 | 2.153833E−09 | 1.799694E−14 | −1.892202E−20 |
| M6 | 6.984230E−01 | −1.682769E−10 | −1.422157E−15 | 1.234832E−20 |

| Surface | D | E | F | G |
|---|---|---|---|---|
| M1 | 4.091038E−24 | −5.790509E−29 | 3.296826E−34 | 8.178384E−41 |
| M2 | 1.255234E−21 | −1.379809E−25 | 5.435466E−30 | −4.566966E−36 |
| M3 | 1.475407E−23 | −5.835055E−28 | 1.288505E−32 | −3.671165E−37 |
| M4 | 4.320243E−35 | 4.670696E−39 | −4.109431E−45 | 2.963010E−51 |
| M5 | −6.296522E−25 | 2.964336E−29 | 6.191151E−34 | −1.998284E−38 |
| M6 | −1.683381E−25 | 8.658821E−31 | −3.676860E−36 | −5.905802E−41 |

The mirrors M1a and M1b on the one hand and M2a and M2b on the other hand may therefore be portions of one and the same mirror. However, this is not compulsory. The mirrors M1a, M1b, M2a, M2b may equally all be arranged spatially separated from one another.

The mirrors M1a/b and M2a/b of the two field groups 20, 21 are used in the shape of ring segments and off-axis in relation to the optical axis 19. The employed optical reflection surface of the mirrors M1 and M2 thus lies at a distance from the optical axis 19.

The employed optical reflection surface of the mirror M3 is approximately centred on the optical axis 19.

The pupil plane 23 lies in the imaging light path of the projection optical system 8 in the region of the reflection of the individual rays 25 on the mirror M3. In the imaging light path between the mirrors M4 and M5, spatially in between the mirrors M6 and M5, lies an intermediate image plane 26 of the projection optical system 8.

Between the mirrors M2a/b and M3, the individual rays 25 pass through a through-opening 27 in the mirror M4. The mirror M4 is used around the through-opening 27. The mirror M4 is thus an obscured mirror. As well as the mirror M4, the mirrors M5 and M6 are also obscured and both likewise include a through-opening 27.

The mirror M3, i.e. the fourth to last mirror in the light path before the image fields 9 and 10, is not obscured. An outer edge 28 of the optically effective reflection surface of the mirror M3 provides a central shadowing of the projection optical system 8, i.e. of the imaging optical system, in an exit pupil plane 29 in the imaging light path in the region of the reflection on the mirror M5. The mirror M3 thus defines the pupil obscuration of the projection optical system 8. The mirror M3 therefore shadows the light path between the mirrors M4 and M5.

The distance between the fourth last mirror M3 and the last mirror M6 is equal to approximately 22% of the distance of the object plane 6 from the image plane 11 in the embodiment of the projection optical system 8 of FIG. 3.

The projection optical system 8 of FIG. 3 has a numerical aperture of 0.55 on the image side. The projection optical system 8 of FIG. 3 has a maximum root mean square (rms) wavefront error of 1.4 nm. The maximum distortion is 1.4 nm. The pupil obscuration is 16.8%.

The light beams 15, 16 of the two imaging light paths, which until now have been guided on separate mirrors M1a/b, M2a/b, overlap in the aperture group 22, i.e. on the mirrors M3 to M6

In the projection optical system 8 of FIG. 3, the distance A (cf. also FIGS. 9 and 10) between the two object fields 4, 5 is 164 mm.

The projection optical system 8 can be used within the projection exposure installation 1 in the production of a microstructured component in the following manner: Initially, the reticle 12 and the wafer 13 are prepared. Subsequently, a structure, arranged in the first object field 4, on the reticle 12 is projected onto a light-sensitive layer of the wafer 13 in the first image field 9. The exposed light-sensitive layer is then displaced in the positive y direction from the first image field 9 to the second image field 10 by displacing the wafer 13 via the substrate support 14. Subsequently, a structure, arranged in the second object field 5, on the reticle 12 is projected onto the previously exposed light-sensitive layer of the wafer 13 in the second image field 10. In this way, a microstructure is produced on the wafer 13. As far as the basic procedure is concerned, but not the use of the optical components shown here, this method is known as a "double exposure" method and allows smaller structures than would be possible with a conventional "single exposure" method to be microstructured. A double exposure method which can be used with the projection exposure installation 1 is disclosed, for example, in the professional article A. Poonawala, Y. Borodovsky, and P. Milanfar, "ILT for Double Exposure Lithography with Conventional and Novel Materials", Proceedings of the SPIE Advanced Lithography Symposium, February 2007. In this professional article, the use of a second field region for receiving the topography of a wafer, as discussed below, is also explained. Further wafer-monitoring methods which can be used with the disclosed variants of the projection exposure installation 1 are explained in US 2007/0080281 A1 and in U.S. Pat. No. 5,268,744.

In an alternative or additional possible application of the projection optical system 8 within the projection exposure installation 1, after the preparation of the reticle 12 and of the wafer 13, a light-sensitive layer of the wafer 13 in the first image field 9 is initially exposed with a preparation light of a first light wavelength, which is coupled into the first image field 9 via the first object field 4 and the field group 20. Subsequently, the light-sensitive layer prepared in this manner is displaced from the first image field 9 to the second image field 10, as explained previously in the above. Subsequently, a structure, arranged in the second object field 5, on the reticle 12 is projected onto the prepared light-sensitive layer of the wafer 13 in the second image field 10. In this way, a microstructure is produced on the wafer 13. In a variant of the method, the reticle 12 does not cover the first object field 4. Alternatively, it is possible to prepare the reticle 12 only after the preparation of the light-sensitive layer with the preparation light in the location of the object field 5.

Irradiation with preparation light may for example be used to make the light-sensitive layer on the wafer 13 more sensitive for the subsequent irradiation process with the illumination light 3.

In an alternative or additional possible application of the projection optical system 8 within the projection exposure installation 1, the sequence of the exposure of the wafer 13, with preparation light and with illumination light, is reversed as compared to the method explained above. In the first image field 9, the light-sensitive layer on the wafer 13 is initially exposed with the illumination light 3. After the displacement of the previously exposed light-sensitive layer on the wafer 13 to the second image field 10, the previously exposed light-sensitive layer is irradiated with the preparation light in the second image field 10.

In a further application of the projection optical system 8 within the projection exposure installation 1, the projection optical system 8 has additional components, which are shown in broken lines in FIG. 2. This includes an optical sensing device 30, which may for example be a CCD camera. The optical sensing device 30 is arranged in such a way that the optically sensitive surface thereof encompasses the object field 5 of the field group 21. The optical sensing device 30 thus encompasses the imaging rays between the image field 10 and the object field 5. The optical sensing device 30 is in a signal connection with a central controller 32 of the projection exposure installation 1 via a signal line 31.

Furthermore, for this further application, the projection optical system 8 has within the projection exposure installation 1 a correction device 33 for the correction of the imaging properties of the field group 20, i.e. of the field group which is not directly associated with the optical sensing device 30. In turn, the correction device 33 is in a signal connection with the controller 32 via a signal line 34.

The correction device 33 may for example be a mirror, which is displaceable via at least one actuator (not shown), or an adjustable stop or filter element.

In an application of the projection optical system 8 within the projection exposure installation 1 where the components 30 to 34 are used, the reticle 12 is prepared in the region of the object field 4 and the wafer 13 in the region of the two image fields 9 and 10. Subsequently, the topography of the wafer is measured in the image field 10 via the optical sensing device 30. Via the measured topography and the corresponding topography data conveyed from the optical sensing device 30 to the controller 32, the controller 32 calculates a correction value. Subsequently, the imaging properties of the projection optical system 8 are corrected on the basis of the calculated correction value by actuating the correction device 33. Finally, the structure which is arranged in the object field 4, on the reticle 12, is projected onto a light-sensitive layer of the wafer 13 in the image field 9 with the corrected projection optical system 8.

In an alternative or additional possible application of the projection optical system 8 with the additional components 30 to 32, i.e. with the optical sensing device 30, the control device 32 and the associated signal line 31, the reticle is again prepared in the object field 4 and the wafer in the image fields 9 and 10. Subsequently, the structure which is arranged in the first object field 4, on the reticle 12, is projected onto a light-sensitive layer of the wafer 13 in the image field 9 with the projection optical system 8. Subsequently, the wafer 13 is displaced in such a way that the portion initially lying in the image field 9 is transferred into the image field 10. Subsequently, the topography, affected by the aforementioned projection, of the wafer 13 in the image field 10 of the projection optical system 8 is measured via the optical sensing device 30, which is arranged in the object field 5. In this way, the result of the projection step can be subjected to an immediate check.

Figure 4:
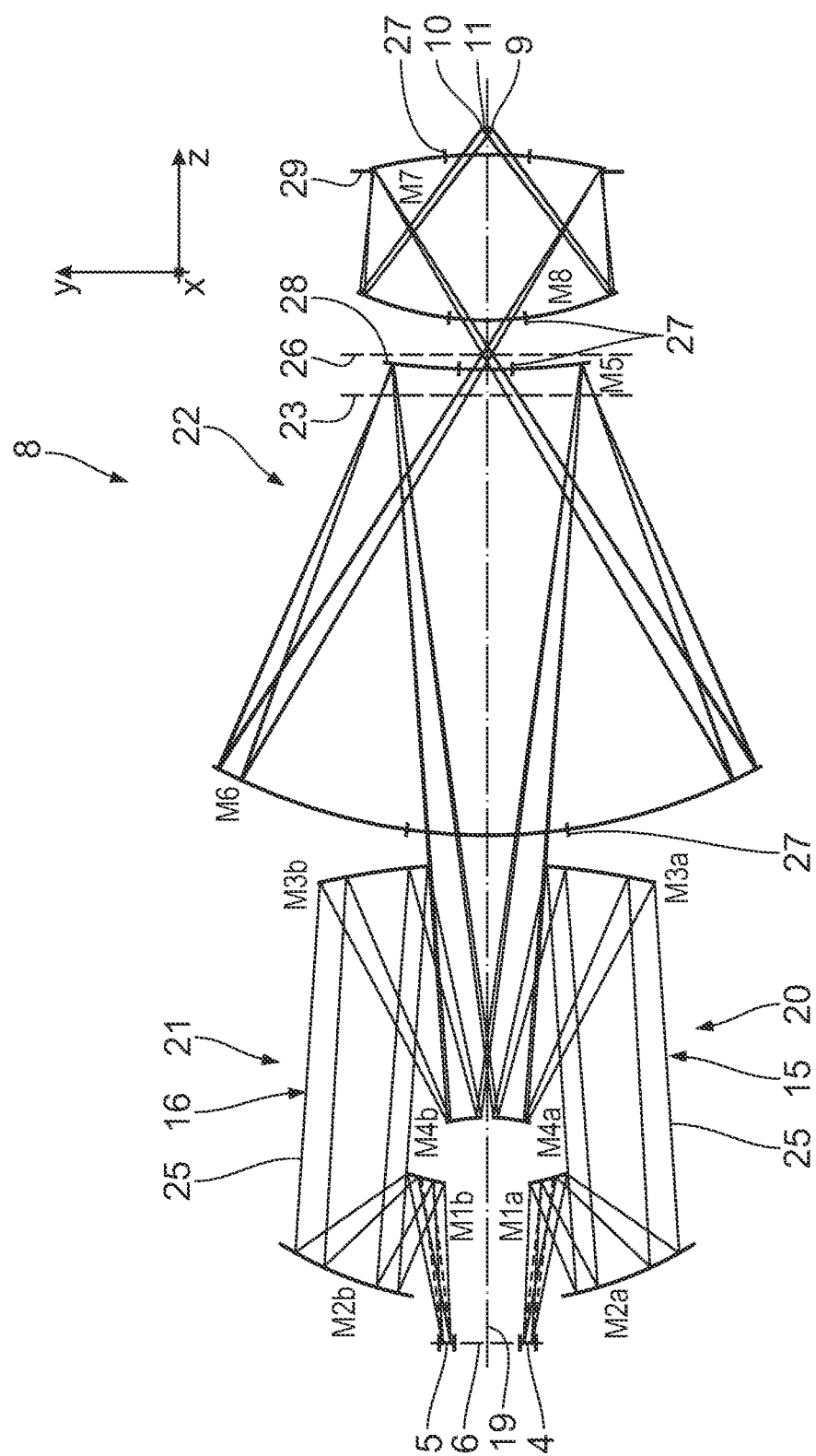
FIGS. 4 and 5 are meridional sections of variants of optical constructions of FIG. 2.

FIG. 4 shows a further embodiment of a projection optical system 8 for use in the projection exposure installation 1. Components which correspond to those which have been previously explained with reference to FIGS. 1 to 3 have like reference numerals and will not be discussed in detail again. The applications of the projection optical system of FIG. 4 also correspond to those which were previously explained in the above, unless otherwise indicated below.

The first field group 20 includes a total of four mirrors M1a, M2a, M3a and M4a in the embodiment of FIG. 4. The second field group 21 includes the mirrors M1b, M2b, M3b and M4b, which lie, comparably with the mirrors M1 and M2 of the embodiment of FIG. 3, on portions, which are arranged symmetrically in relation to the optical axis 19, of a reflection surface which is rotationally symmetric about the optical axis 19 and on which the mirrors M1a, M2a, M3a and M4a also lie in portions respectively spatially separated therefrom. The reflection surfaces of the mirrors M1a and M1b, the mirrors M2a and M2b, the mirrors M3a and M3b and the mirrors M4a and M4b thus lie pairwise on the same surface, arranged rotationally symmetrically in relation to the common optical axis 19. The separation between the mirrors M4a and M4b is in this case relatively small as compared to the separations of the mirrors M1 to M3.

The aperture group 22 includes the following mirrors M5 to M8, of the projection optical system 8 of FIG. 4, in the imaging light path.

The mirrors M3a and M3b on the one hand and M6 on the other hand are arranged back to back as regards the reflection surfaces thereof. The same applies to the mirrors M1a and M1b on the one hand and M4a and M4b on the other hand.

The pupil plane 23 lies in the light path between the mirrors M5 and M6 close behind the reflection of the individual rays 25 on the mirror M5. The intermediate image plane 26 lies in the light path between the mirrors M6 and M7. This plane lies spatially in between the mirrors M5 to M8, which are likewise used back-to-back as regards the reflection surfaces thereof. In the embodiment of FIG. 4, the exit pupil plane 29 is in the region of the reflection of the individual rays 25 on the mirror M7.

The projection optical system 8 of FIG. 4 has a root mean square (rms) maximum wavefront error of 0.6 nm, a distortion which is less than 1 nm, and a pupil obscuration of 6%.

The mirrors M1, M4 and M5 are convex. The mirrors M2, M3, M6, M7 and M8 are concave. The mirrors M5 to M8 each include a central through-opening 27, and are therefore obscured.

The projection lens system 8 of FIG. 4 also has a reduction scale of 8. The image-side numerical aperture of the projection lens system 8 of FIG. 4 is 0.60.

The optical data for the projection optical system 8 of FIG. 4 are shown in the following two tables, which correspond in terms of their layout to the tables for FIG. 3.

| Surface | Radius | Thickness | Operating mode |
|---|---|---|---|
| Object plane | INFINITY | 182.885 | |
| M1 | 312.514 | −135.045 | REFL |
| M2 | 461.057 | 514.193 | REFL |
| M3 | −989.211 | −295.490 | REFL |
| M4 | −210.779 | 875.015 | REFL |
| M5 | 760.298 | −545.015 | REFL |
| M6 | 698.490 | 798.704 | REFL |
| M7 | −576.011 | −19.744 | REFL |
| STOP | INFINITY | −173.945 | |
| M8 | 347.848 | 224.078 | REFL |
| Image plane | INFINITY | 0.000 | |

| Surface | K | A | B | C |
|---|---|---|---|---|
| M 1 | 0.000000E+00 | 2.054833E−08 | −4.009641E−13 | 7.171735E−17 |
| M 2 | 0.000000E+00 | 3.334553E−10 | −7.634038E−15 | 1.024823E−19 |
| M 3 | 0.000000E+00 | −5.191038E−10 | −4.805715E−16 | 1.117253E−19 |
| M 4 | 0.000000E+00 | −8.530524E−08 | −7.872800E−12 | −8.643400E−16 |
| M 5 | 0.000000E+00 | −9.493122E−10 | −4.519746E−14 | 2.842871E−19 |
| M 6 | 0.000000E+00 | 1.067524E−10 | 3.344389E−16 | 8.381905E−22 |
| M 7 | 0.000000E+00 | 3.431647E−10 | −3.006760E−15 | 1.681919E−19 |
| M 8 | 0.000000E+00 | −5.212207E−09 | −4.936095E−14 | 3.981107E−19 |

| Surface | D | E | F | G |
|---|---|---|---|---|
| M 1 | −2.913353E−21 | 1.088107E−25 | 0.000000E+00 | 0.000000E+00 |
| M 2 | −9.460244E−25 | 3.872599E−30 | 0.000000E+00 | 0.000000E+00 |
| M 3 | −1.418804E−24 | 9.313360E−30 | 0.000000E+00 | 0.000000E+00 |
| M 4 | −1.810090E−20 | −3.582650E−23 | 0.000000E+00 | 0.000000E+00 |
| M 5 | −9.298310E−24 | −1.362975E−28 | 0.000000E+00 | 0.000000E+00 |

-continued

| | | | | |
|---|---|---|---|---|
| M 6 | 2.378219E−27 | 2.644241E−33 | 3.062582E−38 | 0.000000E+00 |
| M 7 | −1.186133E−24 | 2.512989E−29 | 0.000000E+00 | 0.000000E+00 |
| M 8 | 3.278180E−24 | −3.575793E−29 | 0.000000E+00 | 0.000000E+00 |

In the projection optical system 8 of FIG. 4, the distance A (cf. also FIGS. 9 and 10) between the two object fields 4, 5 is 88.308 mm.

Figure 5:
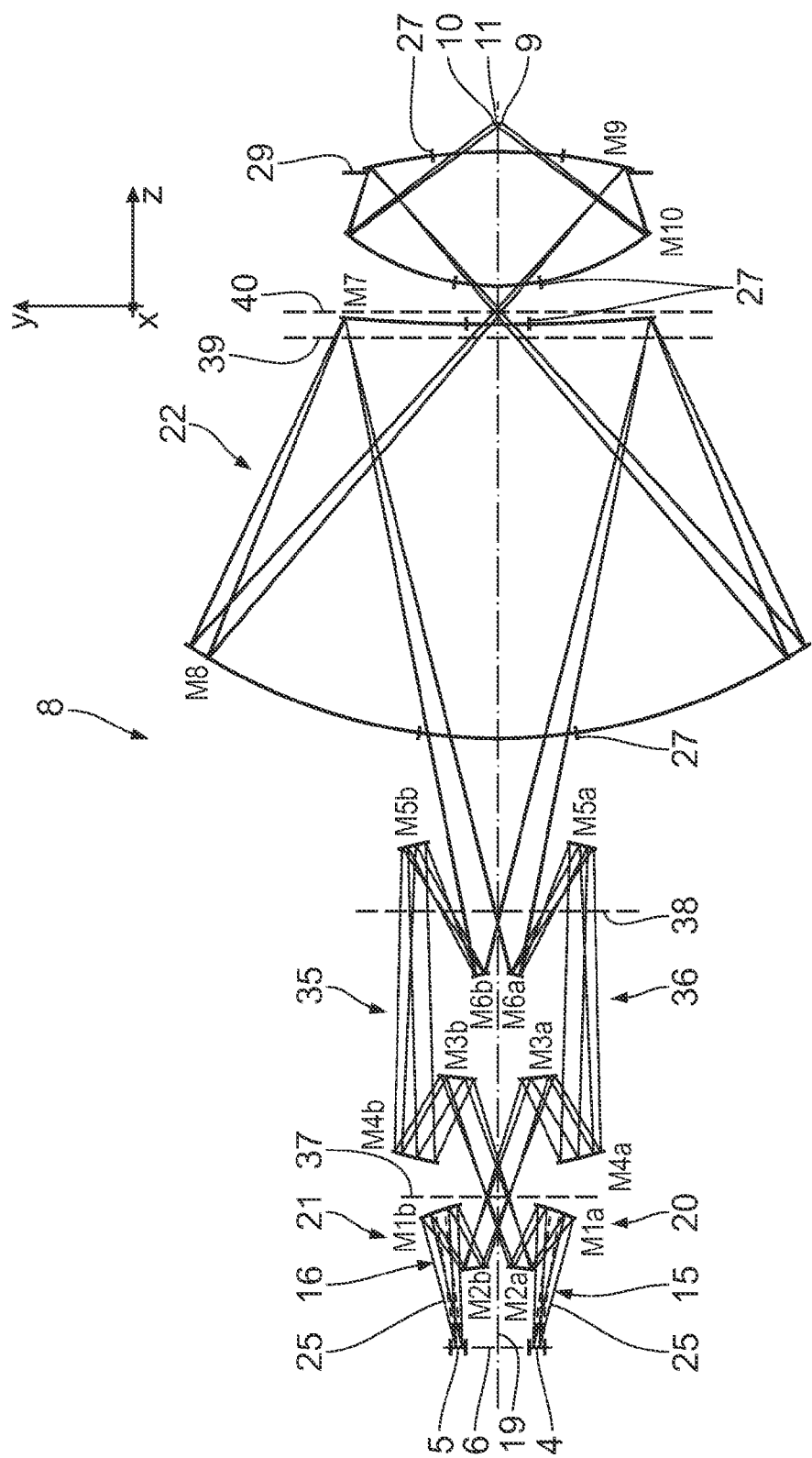

A further embodiment of a projection optical system 8 is shown in FIG. 5. Components which correspond to those which have been previously explained with reference to FIGS. 1 to 4 have like reference numerals and will not be discussed in detail again. The applications of the projection optical system of FIG. 5 also correspond to those which were previously explained in the above, unless otherwise indicated below.

Proceeding from the object fields 4, 5, the projection optical system 8 of FIG. 5 first has two field groups 20, 21 with mirrors M1a, M2a on one side and M1b, M2b on the other, which are similar in construction to the field groups 20, 21 of the embodiment of FIG. 3.

The embodiment of FIG. 5 has, arranged after the two field groups 20, 21, two further field groups 35, 36, respectively including four mirrors M3a, M4a, M5a, M6a on one side and M3b, M4b, M5b, M6b on the other. The field group 35 is in this case arranged after the field group 20 in the light path of the individual rays 25 proceeding from the object field. The field group 36 is arranged after the field group 21 in the light path of the individual rays 25 proceeding from the object field 5. In FIG. 5, the field group 35 lies above the optical axis 19 and the field group 36 lies below the optical axis 19. In turn, the mirrors M1 to M6 of the field groups 20, 21, 35, 36 each include two mirrors a/b which are outside the axis and of which the reflection surfaces lie on a common surface which is rotationally symmetrical in relation to the common optical axis 19.

A first pupil plane 37 of the projection optical system 8 of FIG. 5 lies between the field groups 20 and 35 on the one hand and 21 and 36 on the other hand. After the first pupil plane 37, the beams of individual rays associated with the two object fields 4, 5 separate completely again, in such a way that the following first mirrors M3a/b of the field groups 35, 36 are also spatially separated from one another.

The mirrors M1a and M1b on the one hand and M4a and M4b on the other lie back to back as regards the reflection surfaces thereof. The same applies to the mirrors M3a and M3b on the one hand and M6a and M6b on the other hand.

The mirrors M1, M4, M5, M8, M9 and M10 are concave. The mirrors M2, M3, M6 and M7 are convex.

The mirrors M7 to M10 belong to the aperture group 22 of the projection optical system of FIG. 5. The mirrors M7 to M10 each include a central through-opening 27, and are therefore obscured.

In the light path between the mirrors M5a and M6a on the one hand and M5b and M6b on the other lies a first intermediate image plane 38 of the projection optical system 8. In the vicinity of the reflection of the individual rays 25 on the mirror M7 lies a further pupil plane 39, which corresponds approximately to the pupil plane 23 of the embodiment of FIG. 4. In the light path between the mirrors M8 and M9 lies a further intermediate image plane 40 of the projection optical system 8 of FIG. 5. This further intermediate image plane 40 lies spatially in between the mirrors M7 and M10.

As regards the reflection surfaces thereof, the mirrors M5a and M5b on the one hand and M8 on the other hand are arranged back-to-back relative to one another. As regards the reflection surfaces thereof, the mirrors M7 and M10 are arranged back-to-back relative to one another.

The exit pupil plane 29 is arranged in the vicinity of the reflection of the individual rays 25 on the mirror M9.

The projection optical system 8 of FIG. 5 has reduction scale of 8× and a numerical aperture of 0.80. The root mean square (rms) of a wavefront error is 2 nm. The distortion is at most 1.5 nm and the pupil obscuration is 9%.

The optical data for the projection optical system 8 of FIG. 5 are shown in the following two tables, which correspond in terms of their layout to the tables for FIG. 3.

| Surface | Radius | Thickness | Operating mode |
|---|---|---|---|
| Object plane | INFINITY | 231.437 | |
| M1 | −288.093 | −103.544 | REFL |
| M2 | −377.155 | 292.180 | REFL |
| M3 | 448.302 | −138.636 | REFL |
| M4 | 454.8 | 523.231 | REFL |
| M5 | −589.203 | −216.254 | REFL |
| M6 | −145.829 | 1018.283 | REFL |
| M7 | 2703.619 | −649.781 | REFL |
| M8 | 912.571 | 920.886 | REFL |
| M9 | −812.217 | −31.279 | REFL |
| STOP | INFINITY | −179.826 | |
| M10 | 359.686 | 256.105 | REFL |
| Image plane | INFINITY | 0.000 | |

| Surface | K | A | B | C |
|---|---|---|---|---|
| M1 | 0.000000E+00 | −2.770331E−09 | −1.945643E−13 | 1.458478E−17 |
| M2 | 0.000000E+00 | −5.212535E−09 | 1.710190E−12 | −8.085597E−16 |
| M3 | 0.000000E+00 | −3.752077E−08 | 5.246057E−14 | −6.894048E−17 |
| M4 | 0.000000E+00 | −2.462750E−09 | −3.344608E−14 | −1.092346E−19 |
| M5 | 0.000000E+00 | −5.521295E−10 | −4.038243E−14 | 6.719521E−19 |
| M6 | 0.000000E+00 | −3.262600E−07 | −1.087971E−10 | −1.914029E−14 |
| M7 | 0.000000E+00 | 4.368648E−10 | −1.436480E−15 | −9.017326E−21 |
| M8 | 0.000000E+00 | 4.738372E−11 | 6.475997E−17 | 8.529830E−23 |
| M9 | 0.000000E+00 | 1.300125E−09 | −3.133782E−15 | 2.232463E−19 |
| M10 | 0.000000E+00 | −1.582356E−09 | −1.336421E−14 | −2.713010E−20 |

| Surface | D | E | F | G |
| --- | --- | --- | --- | --- |
| M1 | −1.046226E−21 | 5.585585E−26 | −2.261643E−30 | 4.656384E−35 |
| M2 | 5.785045E−19 | −1.744933E−22 | 3.203600E−26 | −2.339477E−30 |
| M3 | 1.505618E−20 | −1.372039E−24 | 6.258658E−29 | −1.139523E−33 |
| M4 | −1.945640E−23 | 1.214453E−28 | 3.518208E−33 | −1.581797E−37 |
| M5 | −1.134436E−23 | 2.244576E−28 | −2.347477E−33 | 1.853695E−39 |
| M6 | 8.830341E−18 | −1.561330E−20 | 6.912490E−24 | −8.162979E−27 |
| M7 | 8.083936E−26 | −5.639881E−30 | 3.439245E−35 | −4.819066E−40 |
| M8 | 1.142674E−28 | 4.929596E−35 | 2.814036E−40 | 5.135289E−46 |
| M9 | −3.720192E−24 | 5.185605E−29 | −4.428414E−34 | 1.816673E−39 |
| M10 | 4.748659E−25 | −1.040642E−29 | 5.109331E−35 | −4.742038E−41 |

In the projection optical system 8 of FIG. 5, the distance A (cf. also FIGS. 9 and 10) between the two object fields 4, 5 is 104 mm.

Figure 6:
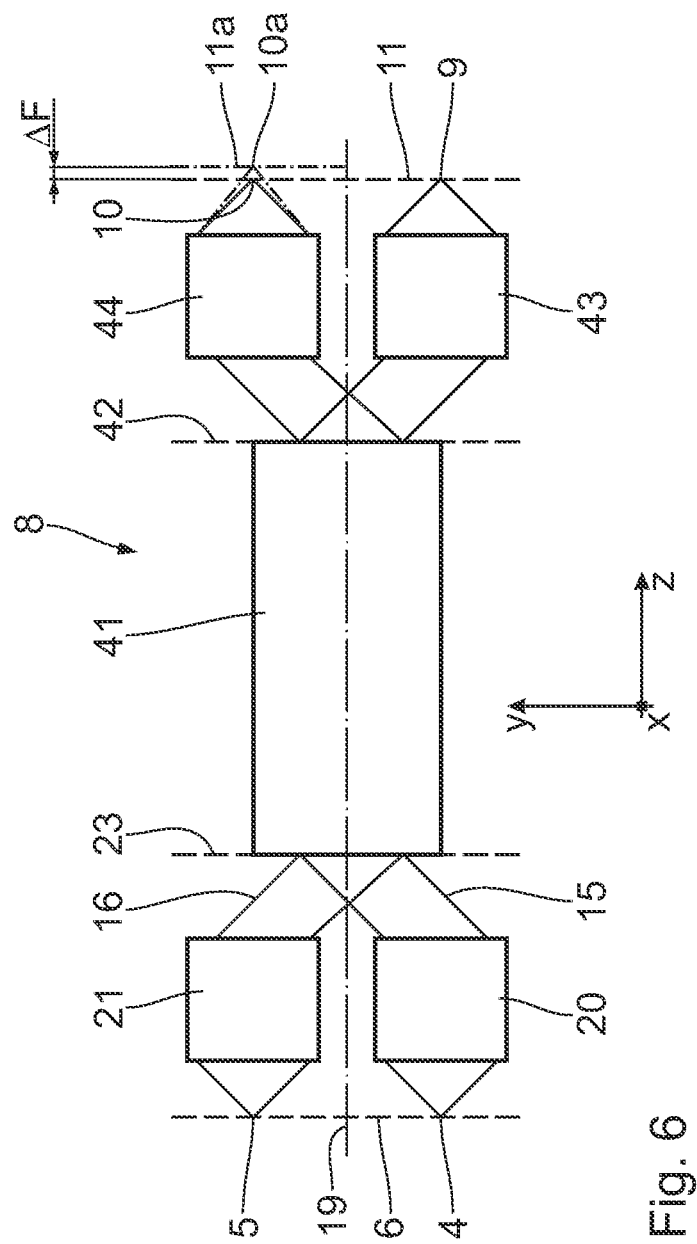
FIG. 6 is a schematic view, similar to FIG. 2, of an imaging optical system including two field mirror groups, each between one of two object fields and an entrance pupil plane of the imaging optical system, an aperture mirror group between the entrance pupil plane and an exit pupil plane of the imaging optical system, and two further field mirror groups, in each case between the exit pupil plane and one of the two image planes.

FIG. 6 shows a further embodiment of a projection optical system 8, in a view similar to that of FIG. 2. Components which correspond to those which have been previously explained with reference to FIGS. 1 to 5 have like reference numerals and will not be discussed in detail again. The same applies to the applications of the projection optical system 8 of FIG. 6.

In the embodiment of FIG. 6, the two object fields 4, 5 and the two image fields 9, 10 are spatially separated from one another. The arrangement of the two field groups 20, 21 on the object field side corresponds to the arrangement of FIG. 2. The projection optical system 8 of FIG. 6 has an aperture group 41, between the first pupil plane 23 and a further pupil plane 42, as a third component group. Between the further pupil plane 42 and one of the two image fields 9, 10 in each case lie two further field groups 43, 44. In the schematic view of the projection optical system 8 of FIG. 6, the arrangement of the component groups 20, 21, 41, 43, 44 is thus reflectionally symmetric in relation to an xy-plane intersecting the aperture group 41 centrally.

The field group 44 may, as is shown in broken lines in FIG. 6, be configured in such a way that an image plane 11a of the field group 44 is separated from the image plane 11 of the image field 9 by a distance ΔF. In the embodiment of FIG. 6, the image plane 11a of the image field 10a is displaced in the positive z direction relative to the image plane 11 of the image field 9. This displacement ΔF may for example only be a few micrometres. It is thus possible to produce images at different depths in the light-sensitive layer on the wafer 13, within the scope of a double exposure method as described above. In this way, it is possible to produce a three-dimensional structure in the wafer 13 by appropriately selected reticle constructions in the object fields 4 and 5.

Figure 7:
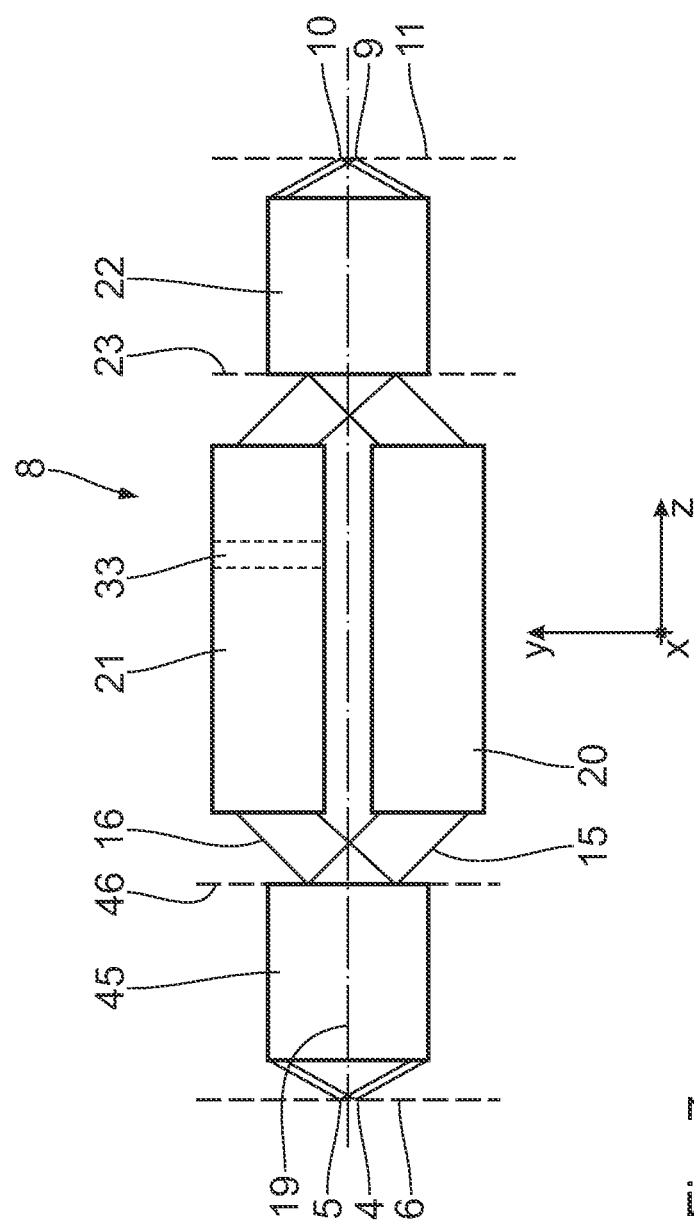
FIG. 7 is a schematic view, similar to FIG. 2, of an imaging optical system including an aperture mirror group between two object fields and an entrance pupil plane of the imaging optical system, two separated field mirror groups, each between the entrance pupil plane and an exit pupil plane of the imaging optical system, and a further aperture mirror group, between the exit pupil plane and two separated image planes.

FIG. 7 shows a further embodiment of a projection optical system 8, in a view similar to that of FIG. 2. Components which correspond to those which have been previously explained with reference to FIGS. 1 to 6 have like reference numerals and will not be discussed in detail again. The same applies to the applications of the projection optical system 8 of FIG. 7.

In the projection optical system 8 of FIG. 7, between the object fields 4 and 5 and the field groups 20, 21, there first lies an aperture group 45, in which the light beams 15, 16 are guided together. The light beams 15, 16 separate only after a first pupil plane 46, and then enter the field group 20, 21.

The field group 21, for example, may in turn contain an optical correction device 33, the function of which is identical to that which has already been explained in relation to the projection optical system 8 of FIG. 2.

Figure 8:
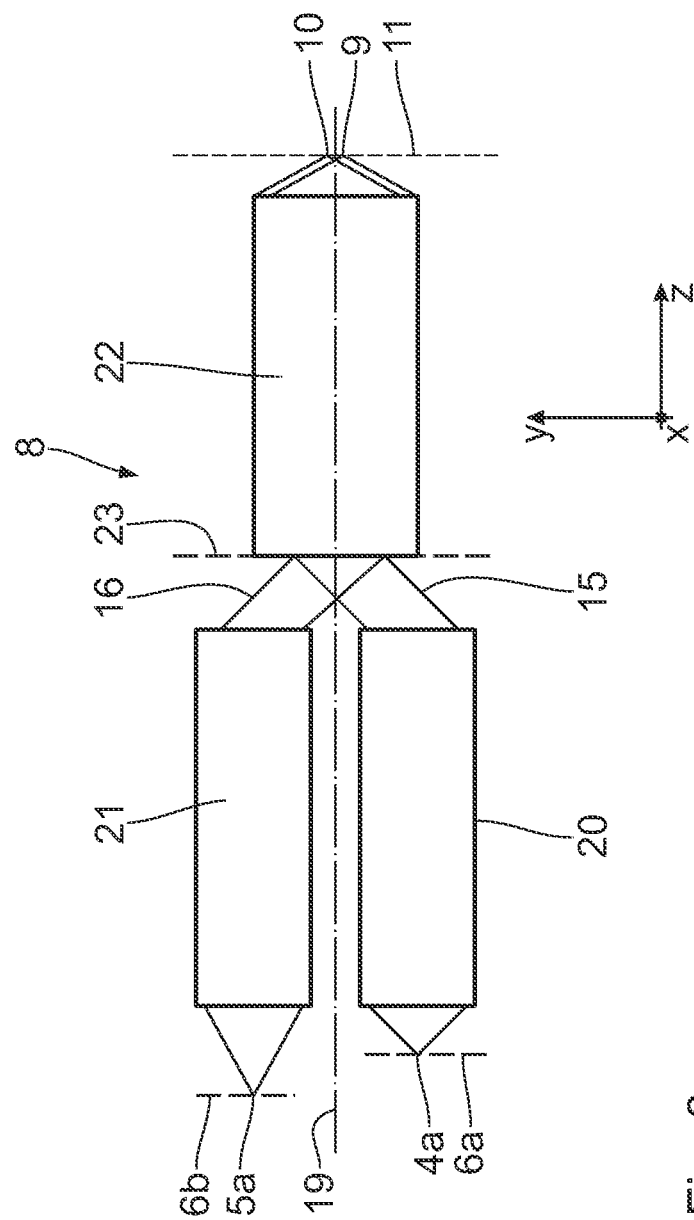
FIG. 8 is a schematic view, similar to FIG. 2, of an imaging optical system with mirror groups arranged comparably to FIG. 2, the object field plane of a first object field, associated with the first field mirror group, being arranged to as to be at a distance from and parallel to the object field plane of a second image field, associated with the second field mirror group.

FIG. 8 shows a further embodiment of a projection optical system 8, in a view similar to that of FIG. 2. Components which correspond to those which have been previously explained with reference to FIGS. 1 to 7 have like reference numerals and will not be discussed in detail again. The same applies to the applications of the projection optical system 8 of FIG. 8.

In the embodiment of FIG. 8, the two field groups 20, 21 belong to object fields 4a, 5a, of which the object planes 6a, 6b extend parallel to one another and are at a distance from one another. The field group 20 is configured, in terms of the optical construction thereof, for a different wavelength to that of the field group 21, for example for preparation or measurement light. In this case, the light beam 15 is preparation light, which may have a different wavelength to that of the illumination light, i.e. the light beam 16.

The projection optical system 8 of FIG. 8, which is otherwise constructed in the same way as the one in FIG. 2, is suitable in particular for the method previously disclosed above for correcting imaging properties via measured topography data and for checking, after a projection exposure procedure, the topography produced thereby on the substrate 13.

In general, the field groups have a smaller aperture than the aperture groups within one of the previously disclosed embodiments of the projection optical system 8.

Figure 9:
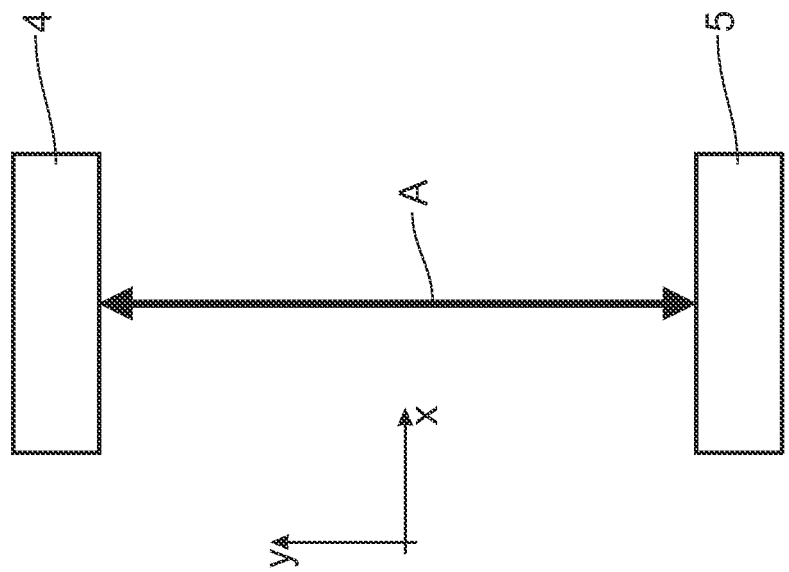
FIG. 9 is a schematic view of two ring fields to illustrate a definition of the distance between them.
Figure 10:
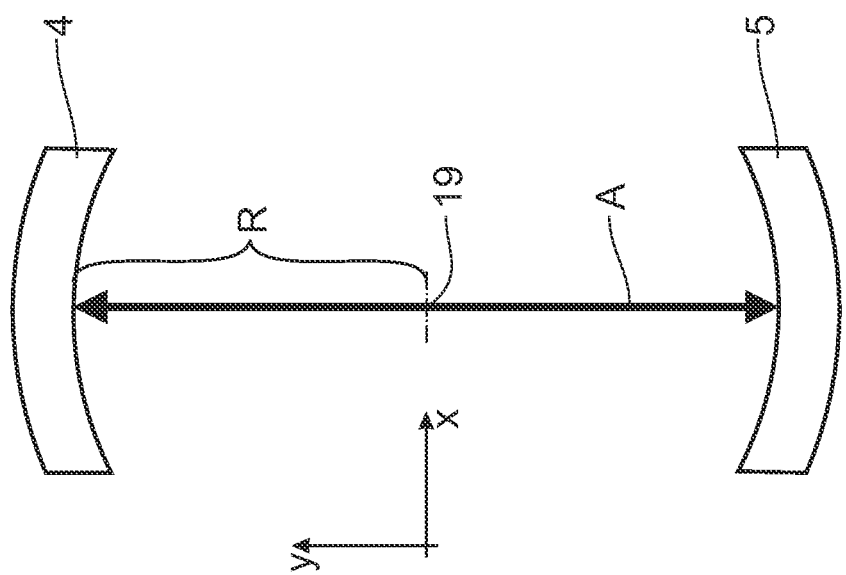
FIG. 10 is a schematic view of two rectangular fields to illustrate a definition of the distance between them.

FIGS. 9 and 10 serve to illustrate a definition of the distance A between the object fields 4, 5. FIG. 9 thus shows the case where the object fields 4, 5 are ring fields, and FIG. 10 shows the case where the object fields 4, 5 are rectangular fields.

In the case of ring fields, where the object fields 4, 5 are thus delimited inter alia by inner arcs which face the optical axis 19, the distance A is defined as the distance between the two points, on the two arcs, at the central height (x=0) in the object fields 4, 5. In the case where the two inner arcs are concentric about the optical axis 19, this distance A is accordingly defined as twice the radius R of the inner arcs which delimit the ring fields. In the case of the rectangular object fields 4, 5, the distance A is defined as the distance between the two longitudinal edges, facing one another, of the object fields 4, 5.

What is claimed is:

1. An optical system configured to image a first object field into a first image field along a first optical path, and the optical system configured to image a second object field into a second image field along a second optical path, the first object field being spatially separated from the second object field, the first image field being spatially separated from the second image field, the optical system comprising:

a plurality of beam-guiding components, wherein all beam-guiding components of the optical system share a single common optical axis, and the first and second optical paths have a common pupil plane;

wherein the plurality of beam-guiding components comprises exclusively mirrors
wherein:
the optical system comprises first, second and third component groups; and
each of the first, second and third component groups is configured to:
a) guide rays proceeding from precisely one object field selected from the group consisting of the first object field and the second object field; or
b) guide rays proceeding from both the first and second object fields; and
wherein:
the optical system has a first pupil plane;
the first component group guides rays proceeding from only the first object field;
the second component group guides rays proceeding from only the second object field;
the third component group guides rays proceeding from both the first and second object fields;
the first and second component groups are between the first and second object fields and the first pupil plane; and
the third component group is between the first pupil plane and the first and second image fields.

2. The optical system of claim 1, wherein the first component group comprises exclusively mirrors.

3. The optical system of claim 1, wherein a numerical aperture of the first component group is less than a numerical aperture of the second component group.

4. The optical system of claim 1, wherein:
the optical system further comprises fourth and fifth component groups;
the fourth component guides rays proceeding from only the first object field;
the fifth component guides rays proceeding from only the second object field;
the optical system has a second pupil plane;
the fourth optical component group is between the first and second pupil planes;
the fifth optical component group is between the first and second pupil planes; and
the third optical component group is between the second pupil plane and the first and second image fields.

5. The optical system of claim 1, wherein the second component group includes a first mirror having a first reflective surface, the third component group includes a second mirror having a second reflective surface, and the first and second reflective surfaces are portions of a surface that is rotationally symmetric relative to the single common optical axis of the optical system.

6. The optical system of claim 1, wherein the optical system is configured so that, during use, light in the first optical path has a different wavelength than light in the second optical path.

7. The optical system of claim 1, wherein the first and second object fields are in the same plane.

8. The optical system of claim 1, wherein the first object field is in a first plane, the second object field is in a second plane, and the first plane is spatially separated from the second plane.

9. The optical system of claim 1, further comprising an optical detector in the first optical path.

10. The optical system of claim 9, further comprising a correction device configured so that, based on information from the optical detector, the correction device corrects imaging properties of the optical system between the second object field and the second image field.

11. The optical system of claim 1, wherein the first image field is in a first plane, the second image field is in a second plane, and the first plane is spatially separated from the second plane.

12. The optical system of claim 1, wherein the first and second image fields are in the same plane.

13. The optical system of claim 1, wherein:
the optical system further comprises, fourth and fifth component groups;
the optical system has first and second pupil planes;
the first and second component groups are between the first and second object fields and the first pupil plane;
the third component group is between the first and second pupil planes; and
the fourth and fifth component groups are between the second pupil plane and the first and second image planes.

14. The optical system of claim 13, wherein:
the fourth optical component group is configured to guide rays proceeding from only the first object field; and
the fifth optical component group is configured to guide rays proceeding from only the second object field.

15. The optical system of claim 1, wherein at least one field is in the shape of a ring, the at least one field being selected from the group consisting of the first object field, the second object field, the first image field and the second image field.

16. An installation, comprising:
an illumination system; and
the optical system of claim 1,
wherein the installation is a microlithography projection exposure installation.

17. The installation of claim 16, wherein the installation is configured to operate with EUV radiation.

18. A method, comprising using a microlithography projection exposure installation to produce a microstructured component, wherein the microlithography projection exposure installation comprises an illumination system, and the optical system of claim 1.

19. The method of claim 18, wherein, during the production of the microstructured component:
a light sensitive layer of a wafer is positioned in the first image field;
the light sensitive layer of the wafer is moved from the first image field to the second image field; and
the light sensitive layer of the wafer is positioned in the second image field.

20. The method of claim 18, wherein the method comprises:
measuring a topology or a position of a wafer positioned in the first image field or the second image field;
calculating a correction value based on the measured topology or position; and
correcting image properties of the imaging optical system.

* * * * *

UNITED STATES PATENT AND TRADEMARK OFFICE
CERTIFICATE OF CORRECTION

| | | |
|---|---|---|
| PATENT NO. | : 8,558,991 B2 | Page 1 of 1 |
| APPLICATION NO. | : 12/758530 | |
| DATED | : October 15, 2013 | |
| INVENTOR(S) | : Hans-Juergen Mann | |

It is certified that error appears in the above-identified patent and that said Letters Patent is hereby corrected as shown below:

In the specifications:

Col. 2, line 34, delete "for the a" and insert -- for the --.

Col. 6, line 26, delete "step-per-type" and insert -- stepper-type --.

Col. 9, line 27, delete "M6" and insert -- M6. --.

In the claims:

Col. 17, line 2, In Claim 1, delete "mirrors" and insert -- mirrors; --.

Col. 18, line 14, In Claim 13, delete "comprises," and insert -- comprises --.

Signed and Sealed this
Twenty-eighth Day of January, 2014

Michelle K. Lee
*Deputy Director of the United States Patent and Trademark Office*